United States Patent
Engelking et al.

(12) 
(10) Patent No.: US 6,203,411 B1
(45) Date of Patent: Mar. 20, 2001

(54) METHOD AND APPARATUS FOR POLISHING ELECTRICAL PROBES

(75) Inventors: Steven Engelking; Richard Allan Deckert; Joey Dean Evans, all of San Antonio, TX (US)

(73) Assignees: Sony Corporation, Tokyo (JP); Sony Electronics, Inc., Park Ridge, NJ (US)

(*) Notice: Subject to any disclaimer, the term of this patent is extended or adjusted under 35 U.S.C. 154(b) by 0 days.

(21) Appl. No.: 09/037,707

(22) Filed: Mar. 10, 1998

(51) Int. Cl.[7] .......................................... B24B 1/00

(52) U.S. Cl. ........................ 451/59; 451/342; 451/548

(58) Field of Search ............................... 451/28, 59, 342, 451/548

(56) References Cited

U.S. PATENT DOCUMENTS

| | | | |
|---|---|---|---|
| 5,263,283 | * | 11/1993 | Rudolf et al. . |
| 5,601,475 | * | 2/1997 | Stametz et al. ..................... 451/35 |
| 5,666,063 | * | 9/1997 | Abercrombie et al. . |
| 5,964,651 | * | 10/1999 | Hose ................................... 451/262 |
| 6,004,192 | * | 12/1999 | Bavelloni .......................... 451/178 |

* cited by examiner

*Primary Examiner*—Timothy V. Eley
(74) *Attorney, Agent, or Firm*—Ronald P. Kananen; Rader, Fishman & Grauer

(57) ABSTRACT

A probe polish burnishing assembly has a stem having a substantially spherical surface. This spherical surface makes intimate contact with the concave surfaces commonly present at the tips of set screws used to align the assembly, decreasing the likelihood of slippage and chipping of the stem. Alignment of the assembly is thus made more precise, and the useful life of the assembly is improved. Furthermore, the likelihood of damage to the probe during burnishing is lessened.

13 Claims, 3 Drawing Sheets

US 6,203,411 B1

METHOD AND APPARATUS FOR POLISHING ELECTRICAL PROBES

FIELD OF THE INVENTION

The present invention relates to polishing electrical probes. More particularly, the present invention relates to burnishing pads for use in probe polishing assemblies.

BACKGROUND OF THE INVENTION

In the semiconductor industry, integrated circuits (ICs) are typically tested before release to market. This testing process often involves using probe machines to check numerous die (ranging from 200 to 2,000, maybe more) on a silicon wafer. The dies, if not rejected, are then cut off and mounted on a semiconductor device.

Many conventional probe machines use a probe card that makes contact with the silicon wafer circuitry as it checks for electrical current resistance. The probe card typically contains 16 to 500 or more probe needles set at an angle relative to the plane defined by the surface of the probe card. The wafer is mounted on a chuck and is contacted by the probe card. This contact and other environmental factors introduce debris, such as metal, polymers and organometallic materials, into the probe card. As debris accumulates, the performance of the probe card can be adversely affected. Accordingly, to maintain proper functioning of the probe card, the probe card should be polished free of debris periodically using a probe polishing assembly.

In some conventional probe polishing assemblies, a chuck descends and a stage holding the chuck and the probe polish assembly moves to place a burnishing pad under the probe card. A pneumatic cylinder then lifts the burnishing pad to a position suitable for polishing the probe needles. The burnishing pad then burnishes the probe needles.

For purposes of this discussion, movements of the various components involved in the polishing process can be considered as occurring in three dimensions designated using the familiar XYZ coordinate system. The polishing process involves slightly raising the probe polish assembly in the Z direction. After each thrust in the Z direction, the probe polish assembly is subjected to slight movements in the X and Y directions. The stage on which the polish assembly and chuck are mounted performs the movements in the Z direction at a programmed height and frequency. The stage also executes the movements in the X and Y directions. After the probe card is polished, the burnishing assembly lowers and the probe card returns to a position suitable for probing.

In polishing the probe card, the top surface of the circular burnishing pad should be as coplanar as possible to the plane of the probe needles. Deviations from this norm can prevent some needles from receiving adequate burnishing. If needles are inadequately burnished, the remaining debris potentially introduces contact resistance, which in turn can lead to false measurements. These false measurements can cause the tester to reject the integrated circuit, decreasing the wafer yield. Noncoplanarity between the top surface of the circular burnishing pad and the plane of the probe needles can also cause some needles to be burnished too much. Excessive burnishing wears the needles rapidly and can damage the probe itself.

In some conventional approaches, the burnishing pad is manually planarized using a gauge that measures differences in planarity between the chuck and burnishing pad at different points. Adjustments are made in an attempt to bring these differences to within a tolerance of 0.5 mil from a point on the perimeter of the burnishing pad's top surface to a diametrically opposed point. It can be appreciated that these adjustments are precise and time-consuming.

Adjusting the burnishing pad typically involves fixing a stem, which loosely fits inside an aluminum housing and supports the burnishing pad, into place. The burnishing pad is fixed into position by tightening three Allen-type set screws onto the stem. The set screws' center lines radiate from the center of the housing at 120 degree intervals. Accordingly, the orientation of the burnishing pad can be varied by tightening the set screws to different degrees.

With many burnishing pad arrangements, however, the stem is cylindrical, as illustrated at reference numeral 20 in FIGS. 1 and 3. As illustrated in FIG. 2, a conventional set screw 50 has a concave tip 56 that defines a circle at its distal end. This tip only makes contact with the vertical surface of the stem at no more than two points, namely, the 90 and 270 degree points on the circle. This lack of contact increases the likelihood that the set screws will slip or chip the stem. Moreover, when the cylindrical stem is not vertically aligned, contact with the set screws is limited to one point, further increasing the likelihood that the set screws will slip or chip the stem. When the set screws slip, the top surface of the burnishing pad ceases to be adequately planarized. The operator might not notice this problem for some time, causing wafer yields to decrease dramatically as more ICs are erroneously rejected. In addition, once the problem is found, the burnishing pad must be replanarized, taking the probe device out of commission for hours or even days.

SUMMARY OF THE INVENTION

According to one embodiment of the present invention, a burnishing assembly includes a burnishing pad and a support member arranged to support the burnishing pad. The support member has a surface substantially defined at least in part by a truncated sphere. In certain other embodiments of the present invention, a plurality of set screws are used to alter the orientation of the burnishing pad. Each set screw has a concave surface located at its distal end. These concave surfaces make intimate contact with the surface of the support member. The burnishing assembly can also include a housing that retains the set screws and the support member.

According to another embodiment of the present invention, a burnishing assembly includes a burnishing pad and a support member that supports the burnishing pad. The support member has a surface at least partially defined by a truncated sphere. A plurality of set screws are configured to alter the orientation of the burnishing pad, each set screw having a concave surface located at a distal end. The concave surfaces make intimate contact with the surface of the support member. A housing is configured to retain the set screws and has a seating configured to accept the support member. The seating has a surface defined by a portion of a sphere concentric with the truncated sphere defining the surface of the support member.

In yet another embodiment of the present invention, a probe device having a plurality of probes is burnished using a burnishing pad supported by a support member having a surface at least partially defined by a truncated sphere. A plurality of set screws, each set screw having a concave surface located at a distal end, are selectively tightened to render a plane defined by the burnishing pad parallel to a plane defined by distal ends of the probes. The concave surfaces make intimate contact with the surface of the support member. The burnishing pad is then rotated.

The above summary of the present invention is not intended to describe each illustrated embodiment or every

BRIEF DESCRIPTION OF THE DRAWINGS

These and other aspects and advantages of the present invention will become apparent upon reading the following detailed description and upon reference to the drawings, in which.

Figure 1:
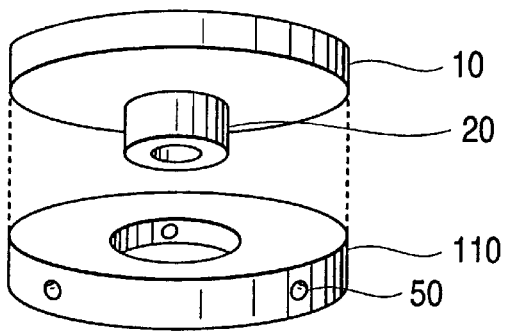
FIG. 1 is an exploded view of a conventional burnishing pad and housing assembly.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the present invention as defined by the appended claims.

DETAILED DESCRIPTION

The present invention is believed to be applicable to a variety of arrangements for testing integrated circuits. The invention has been found to be particularly advantageous in environments in which burnishing pads must be precisely oriented. An appreciation of various aspects of the invention can be gained through a discussion of various application examples operating in such environments.

Contact between set screws used in orienting a burnishing pad and the stem supporting the pad is improved by using a stem substantially shaped as a truncated sphere. This shape provides a convex surface that makes more optimal contact with the concave surfaces of the set screws. As a result, slipping and chipping is reduced. In addition, the stem rests on a spherical surface that is milled into the housing. Stability of the stem is thus improved, resulting in more accurate positioning of the burnishing pad.

Figure 4:
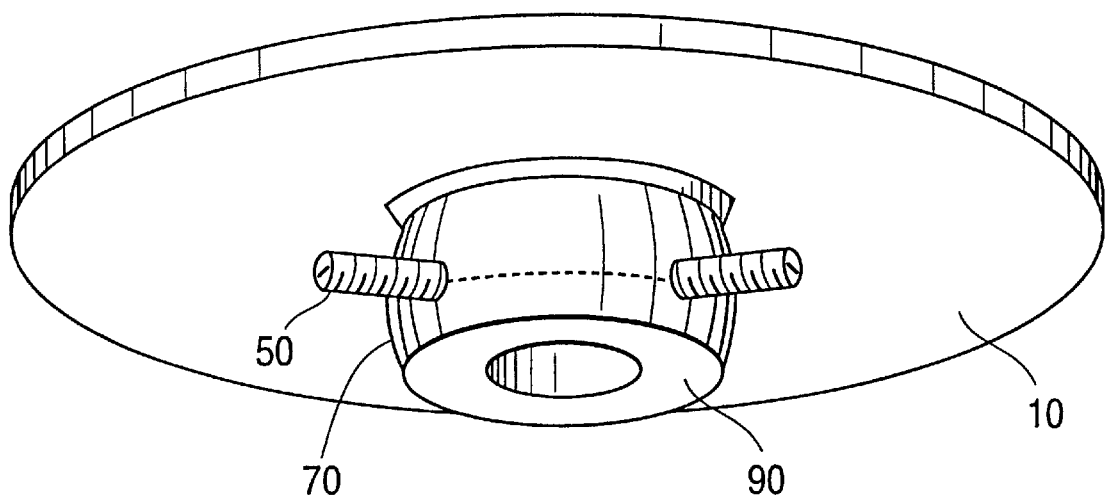
FIG. 4 illustrates a burnishing pad, according to an embodiment of the present invention, having an improved stem that makes effective contact with set screws.

Referring now to the drawings, FIG. 4 illustrates an example burnishing pad assembly according to an embodiment of the present invention. The burnishing pad assembly includes a burnishing pad 10, which is used to abrade debris away from probe needles. The burnishing pad 10 is supported by a stem 90, which is substantially shaped as a truncated sphere. Accordingly, the stem 90 has a surface 70 having a convex shape. It will be appreciated by those skilled in the art that slight variations from a perfectly spherical shape are difficult to avoid, but will not significantly affect the quality of the contact between the stem and the set screws.

Figure 2:
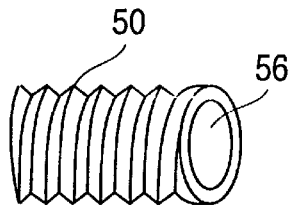
FIG. 2 is a side view of a distal end of a conventional set screw having a concave tip.
Figure 3:
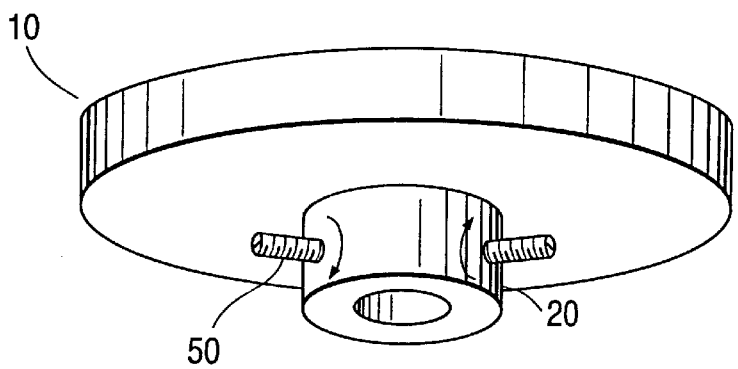
FIG. 3 depicts a set screw contacting a conventional cylindrical stem.
Figure 7:
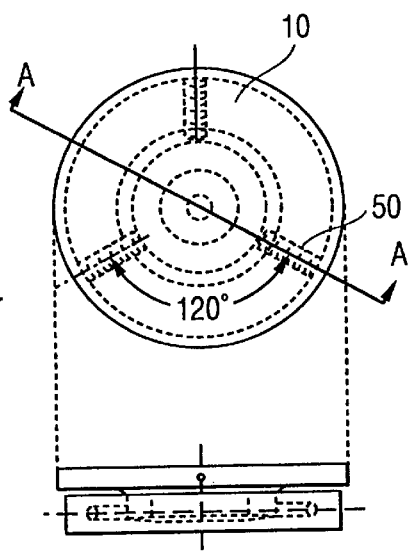
FIG. 7 is a top view, partially in section, of a probe polishing assembly according to an embodiment of the present invention.

To align the burnishing pad 10, one or more set screws 50 are tightened to varying degrees. FIG. 7 illustrates a top view of the burnishing pad 10, with the set screws 50 equally spaced around the burnishing pad 10. The set screws 50 have concave tips 56, as depicted in FIG. 2. The convex surface 70 of the stem 90 makes optimal contact with the concave tips 56. In a particular embodiment of the present invention, the surface 70 of the stem 90 is curved around the entire region over which the set screws 50 can contact the stem 90. With the surface 70 curved over this region, the center of the spherical surface 70 always lies on the center line of the tips 56 of the three set screws 50 regardless of the inclination of the stem 90 in the process of planarizing the burnishing pad 10. That is, the equator, indicated by the dashed line on FIG. 4, of the spherical surface 70 always contacts the tips 56 of the set screws 50 regardless of the rotation to which the stem 90 is subjected. Accordingly, the tangent to the spherical surface 70 is always perpendicular to the center line of the tips 56 of the set screws 50. Because the surface 70 has a uniform curvature, the quality of the contact between the surface 70 and the tips 56 is not affected by the orientation of the stem 90 and burnishing pad 10.

Figure 5:
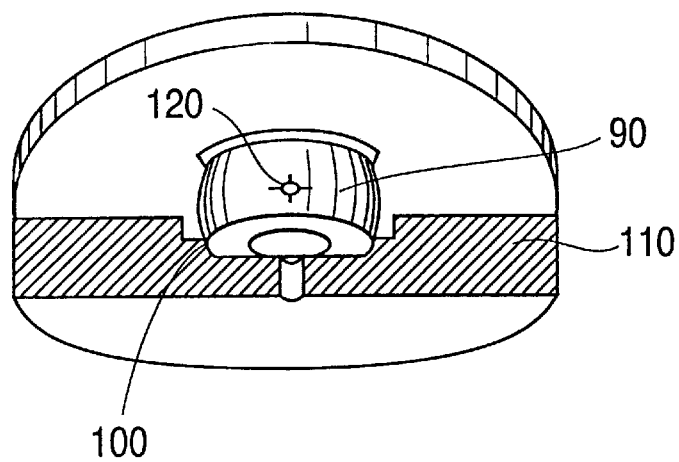
FIG. 5 is a cutaway view of a portion of a burnishing pad assembly, according to an embodiment of the present invention.
Figure 8:
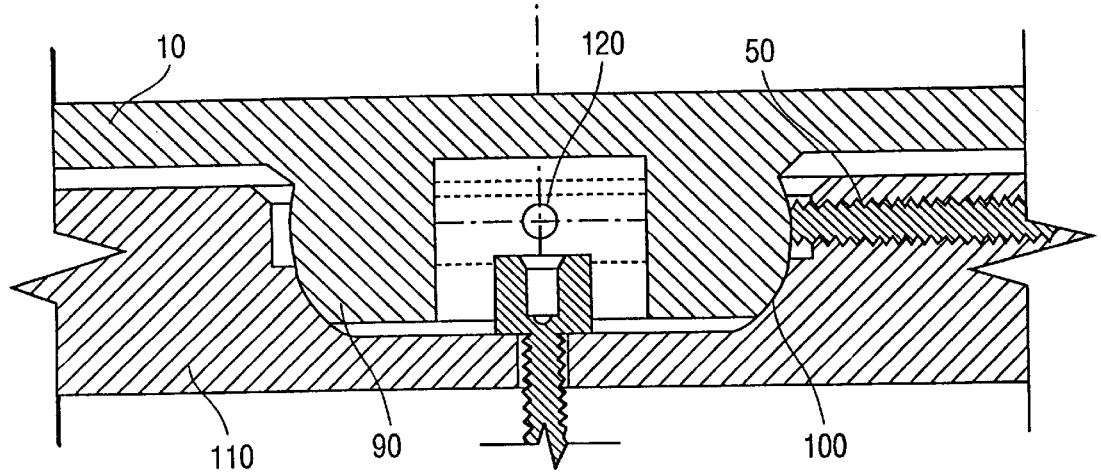
FIG. 8 is a cross-sectional view of a burnishing pad, set screw and housing assembly, according to an embodiment of the present invention.

FIG. 5 illustrates a burnishing pad assembly seated inside a housing, according to another embodiment of the present invention. A cross-sectional view of the burnishing pad assembly and housing is depicted in FIG. 8. In FIG. 5, the stem 90 of the burnishing pad assembly rests in a housing 110. The housing 110 is made of, for example, aluminum, and has a curved seating 100, which defines a portion of a sphere sharing a center 120 with the sphere defined by the surface of the stem 90, milled into it. The seating 100 keeps the center 120 aligned with the center line of the set screws 50 regardless of the orientation of the burnishing pad. In a particular embodiment, the sphere defined by the seating 100 is slightly larger than the sphere defined by the surface of the stem 90 to allow some play between the seating 100 and the stem 90.

Figure 6:
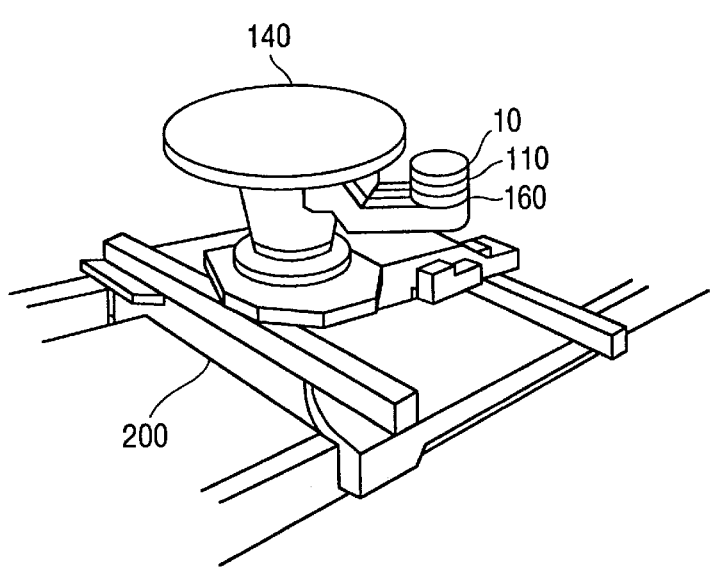
FIG. 6 illustrates a probe polishing assembly, according to another embodiment of the present invention.

FIG. 6 illustrates an example probe polishing assembly according to another embodiment of the present invention. The probe polishing assembly is supported by a stage 200 and includes the burnishing pad 10, the housing 110, and a pneumatic cylinder 160. To polish a probe card, a chuck 140 descends and the stage 200 moves to place the burnishing pad 10 under the probe card. The pneumatic cylinder 160 then lifts the burnishing pad 10 to a position suitable for polishing the probe needles. The burnishing pad 10 then burnishes the probe needles. According to one embodiment of the present invention, the burnishing pad 10 is comprised of molded porcelain. Porcelain produces little friction, making it easy for the stem of the burnishing pad 10 to pivot in the seating of the housing 110 as adjustments are made during planarization. Porcelain also provides an excellent burnishing surface for delicate probe needles.

The various embodiments described above are provided by way of illustration only and should not be construed to limit the invention. Those skilled in the art will readily recognize various modifications and changes that may be made to the present invention without strictly following the example embodiments and applications illustrated and described herein, and without departing from the true spirit and scope of the present invention, which is set forth in the following claims.

What is claimed is:

1. A method for burnishing a probe device having a plurality of probes, the method comprising:

providing a burnishing pad supported by a support member having a surface at least partially defined by a truncated sphere;

providing a plurality of set screws, each set screw having a concave surface located at a distal end, the concave surfaces making intimate contact with the surface of the support member;

selectively tightening the set screws to render a plane defined by the burnishing pad parallel to a plane defined by distal ends of the probes; and rotating the burnishing pad.

2. A burnishing assembly, comprising:

a burnishing pad; and a support member arranged to support the burnishing pad and having a surface substantially defined at least in part by a truncated sphere;

a plurality of set screws configured to alter the orientation of the burnishing pad, each set screw having a concave surface located at a distal end, the concave surfaces making intimate contact with the surface of the support member.

3. A burnishing assembly, according to claim 2, further comprising a housing configured to retain the set screws and the support member.

4. A burnishing assembly, according to claim 3, wherein the housing has a seating configured to accept the support member, the seating having a surface defined by a portion of a sphere concentric with the truncated sphere defining the surface of the support member.

5. A burnishing assembly, according to claim 4, wherein the sphere defining the surface of the seating has a larger radius than the truncated sphere defining the surface of the support member.

6. A burnishing assembly, according to claim 3, wherein the set screws are disposed around the housing at regular intervals.

7. A burnishing assembly, according to claim 2, wherein the burnishing pad comprises porcelain.

8. A burnishing assembly, according to claim 2, wherein the support member comprises porcelain.

9. A burnishing assembly, according to claim 2, further comprising a pneumatic cylinder configured to selectively displace the burnishing pad.

10. A burnishing assembly, according to claim 2, further comprising a stage.

11. A burnishing assembly, according to claim 2, further comprising a plurality of set screws configured to alter the orientation of the burnishing pad, said set screws making intimate contact with the surface of the support member.

12. A burnishing assembly, according to claim 11, further comprising:

a housing configured to retain the set screws and the support member, wherein said set screws are disposed around the housing at regular intervals.

13. A burnishing assembly, comprising:

a burnishing pad;

a support member arranged to support the burnishing pad and having a surface at least partially defined by a truncated sphere;

a plurality of set screws configured to alter the orientation of the burnishing pad, each set screw having a concave surface located at a distal end, the concave surfaces making intimate contact with the surface of the support member; and a housing configured to retain the set screws and having a seating configured to accept the support member, the seating having a surface defined by a portion of a sphere concentric with the truncated sphere defining the surface of the support member.

* * * * *